United States Patent [19]
Poon et al.

[11] 3,964,089
[45] June 15, 1976

[54] JUNCTION TRANSISTOR WITH LINEARLY GRADED IMPURITY CONCENTRATION IN THE HIGH RESISTIVITY PORTION OF ITS COLLECTOR ZONE

[75] Inventors: Hin-Chiu Poon, Gillette; Donald Lee Scharfetter, Mendham, both of N.J.

[73] Assignee: Bell Telephone Laboratories, Incorporated, Murray Hill, N.J.

[22] Filed: June 11, 1975

[21] Appl. No.: 586,056

Related U.S. Application Data

[63] Continuation-in-part of Ser. No. 290,976, Sept. 21, 1972, abandoned.

[52] U.S. Cl. ................................... 357/34; 357/35; 357/63; 357/89; 148/175
[51] Int. Cl.² ................ H01L 29/72; H01L 29/167
[58] Field of Search .................. 357/34, 35, 36, 54, 357/63, 89; 148/90, 175

[56] References Cited
UNITED STATES PATENTS

| | | |
|---|---|---|
| 3,490,962 | 1/1970 | Duffy et al. .......................... 357/89 |
| 3,523,046 | 8/1970 | Grochowski et al. ................. 357/89 |
| 3,585,464 | 6/1971 | Castrucci ............................. 357/54 |
| 3,595,716 | 7/1971 | Kerr et al. ............................ 357/34 |
| 3,600,648 | 8/1971 | Longo .................................. 357/34 |
| 3,638,301 | 2/1972 | Matsuura ............................. 357/35 |
| 3,657,612 | 4/1972 | Wiedmann ........................... 357/35 |
| 3,663,320 | 5/1972 | Maruyama et al. .................. 357/35 |

FOREIGN PATENTS OR APPLICATIONS

695,502 10/1964 Canada ................................ 357/89

*Primary Examiner*—Andrew J. James
*Attorney, Agent, or Firm*—M J Urbano

[57] ABSTRACT

A junction transistor is provided which is especially adapted for use in an amplifier circuit in which third-order intermodulation distortion is especially low. To this end, an epitaxial junction transistor is made to have a substantially linearly graded concentration of the dominant impurity over at least half of the high resistivity portion of its collector zone.

6 Claims, 4 Drawing Figures

GRADIENT = $2 \times 10^{19}$ cm$^{-4}$

JUNCTION TRANSISTOR WITH LINEARLY GRADED IMPURITY CONCENTRATION IN THE HIGH RESISTIVITY PORTION OF ITS COLLECTOR ZONE

Cross Reference to Related Application

This application is a continuation-in-part of copending application Ser. No. 290,976 filed on Sept. 21, 1972 and now abandoned.

Background of the Invention

This invention relates to junction transistors.

In broadband amplifiers, third-order intermodulation distortion is particularly important when many such amplifiers are used in cascade. For example, in long distance analog transmission systems, hundreds of amplifiers may be in cascade and in such a case, third-order intermodulation distortion tends to dominate as a limiting factor in the effective bandwidth of the system, since certain third-order products tend to add in phase, as contrasted with second-order products.

The present invention is directed to a junction transistor especially adapted for use in broadband amplifiers with reduced third-order intermodulation distortion.

In particular, we have found that third-order intermodulation distortion is related to the cutoff frequency-versus-output collector current characteristics of the amplifier, the more linear this characteristic is, the lower the distortion. In the past, little attention was paid to this characteristic and no special effort was made to linearize it.

Summary of the Invention

Moreover, we have found that in a common-emitter transistor amplifier, the linearity of this characteristic can be improved by having less base push-out in the transistor used in the amplifier. Base push-out is the term used to describe the phenomenon of the base zone widening as the emitter current increases. Accordingly, improvement in the linearity and in the third-order intermodulation distortion in such an amplifier can be improved by including therein an epitaxial transistor modified from the prior art form by providing a substantially linearly graded impurity profile over at least half of the epitaxial collector region, especially in the neighborhood of the collecting junction, appropriate for reducing the nonlinearity of the cutoff frequency-versus-collector current characteristic of the transistor. In practice, this is best achieved by providing in this region a substantially linear impurity gradient with a value in the range between $1 \times 10^{19}$ and $2.5 \times 10^{19}$ atoms per centimeter$^4$.

Such a graded impurity profile can be realized in a variety of ways. Ideally, this could be achieved during the growth of the epitaxial layer by control of the impurity content of the vapor being used to grow the epitaxial layer. At the present time, though feasible, this proves to be quite cumbersome and it may be more convenient to achieve the desired impurity profile in the epitaxial region after its growth by a subsequent introduction step, such as by ion implantation.

Moreover, it additionally appears that such a graded impurity profile is also useful to reduce third-order intermodulation distortion in transistor amplifiers of the common-base and common-collector configurations. For these configurations, distortion is reduced by enhancing the cancellation of competing low frequency nonlinearities. In particular, such a profile results in a moderate amount of collector current multiplication, resulting from impact ionization, which is a suitable enhancement mechanism.

Further improvement is also achieved if the thickness of the epitaxial layer is thinned to a value less than would normally be used in the prior art form.

Brief Description of the Drawing

The invention will be more fully understood from the following more detailed discussion taken in conjunction with the accompanying drawing in which.

Detailed Description

Figure 1:
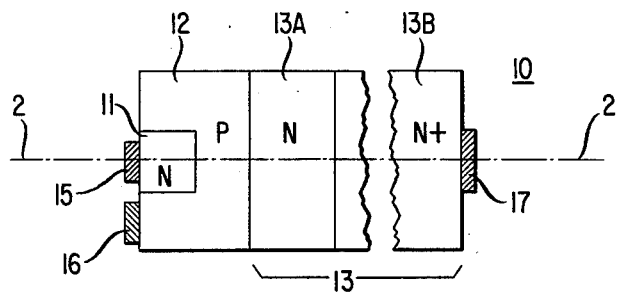
FIG. 1 shows an epitaxial transistor exemplary of the kind involved in the present invention.

With reference now to the drawing, FIG. 1 shows an NPN transistor 10 which in general outline resembles a planar epitaxial transistor of the kind now in widespread use. In particular, it comprises a monocrystalline wafer comprising an N-type emitter zone 11, a P-type base zone 12, and an N-type collector zone 13 comprising a thinner weakly doped portion 13A and a thicker more strongly doped portion 13B. Electrodes 15, 16, and 17 make ohmic connection to the emitter, base and collector zones, respectively. Typically, the wafer includes a surface passivating layer (not shown) of an insulating material, such as silicon dioxide, provided with openings through which the electrodes contact the semiconductor.

Such a transistor is normally formed by starting with a heavily doped N-type monocrystalline substrate, (normally silicon) growing by vapor deposition on such substrate a more lightly doped N-type epitaxial layer of the same material, diffusing into such epitaxial layer an acceptor impurity to form a diffused P-type region which extends partially into the epitaxial layer, and then diffusing a donor impurity into a limited surface region of the newly formed P-type region to reconvert a portion of the surface to N-type. Such reconverted N-type surface portion serves as the emitter zone 11, the P-type region serves as the base zone 12, and the remaining unconverted N-type portion of the epitaxial layer and the original substrate serve as portions 13A and 13B of the collector zone 13. Electrodes are thereafter provided to the various zones as shown in FIG. 1.

Oxide masking and photolithographic techniques typically are used to localize the various diffused zones and electrodes.

Figure 2A:
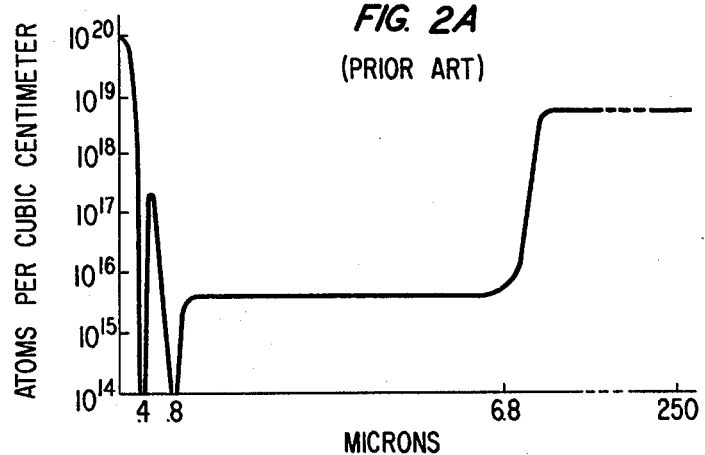
FIGS. 2A and 2B show, by way of comparison, doping profiles characteristic of a typical prior art epitaxial transistor and of an epitaxial transistor illustrative of the present invention, respectively.

FIG. 2A shows the net concentration of the dominant impurity (the absolute value of the difference between the concentration of acceptors and donors) along the line 2—2 shown in FIG. 1 when the transistor is typical of the prior art form.

In particular, it is seen that, in the region corresponding to the lightly doped N-type region 13A adjacent the collecting junction and corresponding to that portion of the original epitaxial layer which is essentially unaffected by the subsequent diffusions, the concentration level is essentially constant. There is some increase in concentration at its interface with the original substrate 13B because of outdiffusion from the more heavily doped substrate during the growth of the epitaxial layer and the subsequent diffusion steps but such increase is quite localized. Typically, in the past, too deep penetration into the epitaxial layer of impurities diffusing out of the substrate has been undesirable as tending to increase the collector capacitance and to decrease the collector breakdown voltage without offsetting advantages. Conversely, there may be a minor decrease localized at the interface with the P-type zone 12 resulting from some spillover of diffused acceptors. However, despite these localized nonuniformities, over the major portion of region 13A, the net concentration of impurities is substantially uniform. A typical value of such level is about $5 \times 10^{15}$ donors per cubic centimeter as is illustrated.

A typical design of such a transistor would comprise an emitter zone about 3 microns wide, 100 microns long and four-tenths of a micron thick, a base zone about 30 microns wide, 125 microns long and four-tenths of a micron thick between the emitting and collecting junctions, and a collector zone made up of a lightly doped portion 6 microns thick and a heavily doped portion about 250 microns thick. Such a transistor would normally be operated with 15 volts as the emitter-collector bias and 100 milliamperes as the collector current to dissipate about 1.5 watts and would have a frequency cutoff for commmonemitter operation of 50 MHz.

Figure 2B:
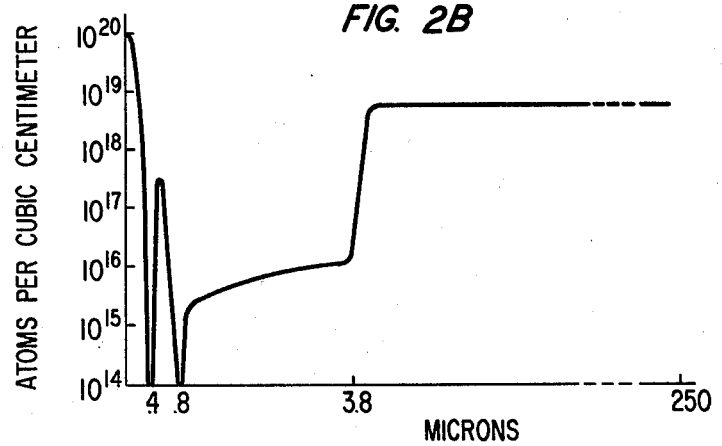

In FIG. 2B, there is shown the net concentration of the dominant impurity in the various zones along the line 2—2 shown in FIG. 1 that is typical of a transistor incorporating the improvement characteristic of the present invention.

Figure 2C:
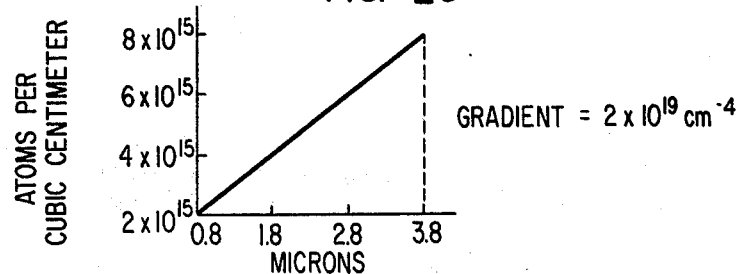
FIG. 2C shows the linear gradient of FIG. 2B plotted as a straight line on rectangular coordinates having linear scales for both ordinate and abscissa.

In particular, it can be seen that the net concentration of the predominant donor impurity varies essentially linearly over the major portion of the lightly doped region 13A (i.e., over at least half of the region between 0.8 and 3.8 microns). Of course, FIG. 2B is a semi-log plot on rectangular coordinates of impurity concentration versus distance; that is, impurity concentration in atoms per cubic centimeter is plotted as the ordinate with uniform divisions corresponding to powers of ten, and distance (or thickness) in microns is plotted as the abscissa with uniform divisions corresponding to a linear scale. Accordingly, the linear gradient, which is the actual physical profile in the transistor, when plotted on FIG. 2B takes the shape of a downwardly directed (convex) curve. However, when plotted on a graph in which both the ordinate and abscissa are linear scales, then the linear gradient takes the slope of a straight line having a positive slope (see FIG. 2C). In the embodiment shown in FIG. 2B, the net concentration increases from a value of about $2 \times 10^{15}$ donors per cubic centimeter near the interface with the base zone to a value of about $8 \times 10^{15}$ donors per cubic centimeter near its interface with the original substrate portion. This linear portion extends over a width of about three microns corresponding to a linear concentration gradient of about $2 \times 10^{19}$ atoms per centimeter$^4$. This lightly doped portion of the collector is thinner than in the typical prior art form depicted by FIG. 2A by a factor of about two. The linear gradient permits the use of a thinner portion 13A of the collector without serious effects on the collector breakdown voltage or collector junction capacitance.

It appears to be important for superior results that the concentration gradient in addition to being substantially linear have a value in the range of between 1 and $2.5 \times 10^{19}$ atoms per centimeter$^4$ for a silicon transistor of the kind described. However, adequate results have been achieved in a transistor of the type shown in FIG. 2B in which both the gradient and median concentration were somewhat smaller, i.e., about $2 \times 10^{18}$ atoms per centimeter$^4$ and $1 \times 10^{15}$ donors per cubic centimeter, respectively. The gradient extended over a three micron thick lightly doped collector portion from the base-emitter junction at 2 microns (rather than 0.8 microns) and the substrate interface at 5 microns (rather than 3.8 microns).

In other regions, the net concentration of the predominant impurity is shown as essentially the same for the two forms of transistors shown in FIGS. 2A and 2B.

The desired concentration gradient of the predominant impurity can be achieved in a variety of ways. In particular, by varying the concentration of impurity present in the vapor used during the growth of the epitaxial layer, the concentration of the impurity in the epitaxial layer can be controlled. Alternatively, the desired gradient can be realized by ion implantation of appropriate donors, varying the energies of the bombarding ions appropriately to achieve the desired distribution. As still another alternative, by appropriate outdiffusion of impurity atoms from the substrate into the epitaxial layer the desired gradient may be achieved. Such outdiffusion generally would involve a heating step distinct from the heating steps normally associated with the growth of the epitaxial layer and the diffusion steps used to form the emitter and base zones.

The foregoing is illustrative of a transistor intended for use primarily as a discrete element rather than as an element in an arrangement in which a number of elements are combined in a single monolithic wafer. In the later instance, a more likely design for the transistor is the so-called "buried collector" form. In this form, the portion of the collector zone corresponding to portion 13B is simply a heavily doped surface region of a substrate whose bulk is of the opposite conductivity type and connection to such zone for interconnection purposes is typically made by a highly doped localized region or plug which extends from the same surface which includes the emitter zone. In other major respects, however, the buried collector form resembles the discrete form. In particular, it includes an epitaxial layer in which are formed the emitter and base zones and which includes adjacent the collecting junction a relatively lightly doped portion of the same conductivity type as the relatively heavily doped "buried" portion, the two portions serving as the collector zone. Moreover, while the buried portion will not ordinarily have a uniform concentration of its predominant impurity since it is normally formed by a diffusion step, its concentration of predominant impurity will throughout be significantly higher than in the epitaxial layer. In such an embodiment, the desired gradient of the predominant impurity in the lightly doped portion of the collector zone located in the epitaxial layer, as before can be realized either by ion implantation or a special outdiffusion step. It will be characteristic of a device made in this fashion that the two portions (corresponding to 13A and 13B) making up the collector zone will typically be of more comparable thicknesses. Moreover, even in this buried collector form, it is feasible to achieve a distribution in which the predominant impurity concentration in the heavily doped collector portion is relatively uniform by the use of ion implantation to introduce the predominant impurity into such buried zone either before or after the formation of the epitaxial layer.

As previously indicated, the preferred distribution of the predominant impurity in the lightly doped portion of the collector zone has an appropriate essentially linear gradient over at least half of the lightly doped portion of the colletor zone. Moreover, the lightly doped portion is that portion in which the predominant impurity concentration is less than $10^{16}$ atoms per cubic centimeter and it should have a thickness of at least two microns. By way of contrast the heavily doped portion generally will have a predominant impurity concentration in excess of $10^{18}$ atoms per cubic centimeter. Naturally there wil be transition regions where the predominant impurity will have an intermediate concentration level but such regions typically will be thin.

The present invention permits an improved thirdorder distortion characteristic for transistors operated either in common-emitter, common-base, or common-collector configurations.

Particularly in the common-emitter configuration, it was first discovered analytically that for frequencies above the cut-off frequency $f_T$ divided by the common-emitter current gain, the third-order intermodulation is determined by the nonlinearity of the cutoff frequency characteristic. Specifically, it was found that this distortion is related to the second derivative of the $f_T$ versus $I_c$ curve, the more linear the curve the smaller the distortion. This can be achieved by having less base push-out effect in the transistor as discussed in a paper entitled "A Theory of Transistor Cutoff Frequency ($f_T$) Falloff at High Current Densities," IRE Transactions on Electron Devices, ED-9, No. 2, March 1962, page 164. The impurity doping profile illustrated in FIG. 2B serves this end particularly well.

Moreover, it appears that the same doping profile also reduces the third-order intermodulation distortion for the common-base and common-collector configurations even though the physical reason is different. For the latter configurations, the graded-collector doping profile described introduces a sufficient amount of avalanche current due to impact ionization during normal operation that the current-gain nonlinearity cancels the exponential emitter nonlinearity. It is accordingly feasible to use the same transistor with superior results in either of the three basic circuit configurations, adding to its versatility.

It is to be understood that the specific embodiment described is merely illustrative of the general principles of the invention. Other designs are, of course, feasible. In particular, the complementary PNP form can be used. Also, any of the semiconductors useful for junction transistors can be used. Moreover, while the invention normally will be practiced in connection with the transistors utilizing an epitaxial layer, in principle this is unnecessary if the desired impurity distribution can be achieved in alternative fashion as by ion implantation.

What is claimed is:

1. A transistor comprising a semiconductive wafer including emitter, base and collector zones, the collector zone comprising a relatively lightly doped portion adjacent the base zone and a relatively heavily doped portion spaced from the base zone by said relatively lightly doped portion characterized in that over at least half of its thickness the lightly doped portion has a substantially linearly graded impurity concentration appropriate for reducing the nonlinearity of the cutoff frequency characteristic of the transistor, and the profile of concentration versus thickness, when plotted on rectangular coordinates having linear scales for both ordinate and abscissa, takes the shape of essentially a straight line.

2. A transistor in accordance with claim 1 further characterized in that the relatively lightly doped portion is at least two microns thick and has a predominant impurity concentration of less than $10^{16}$ atoms per cubic centimeter.

3. A transistor in accordance with claim 2 further characterized in that the impurity concentration over at least half of the thickness of the lightly doped region has a gradient of between $1 \times 10^{19}$ and $2.5 \times 10^{19}$ atoms per centimeter$^4$.

4. A transistor in accordance with claim 1 further including an epitaxial layer and characterized in that the emitter zone, the base zone, and the lightly doped portion of the collector zone are included in the epitaxial layer.

5. A transistor in accordance with claim 1 characterized in that the lightly doped portion is about three microns thick and includes over at least half of its thickness a predominant impurity concentration which varies substantially linearly from about $2 \times 10^{15}$ atoms per cubic centimeter adjacent the base zone to $8 \times 10^{15}$ atoms per cubic centimeter adjacent the more heavily doped collector portion.

6. A transistor in accordance with claim 1 characterized in that the lightly doped portion is about three microns thick and includes over at least half of its thickness a predominant impurity concentration having a median value of about $1 \times 10^{15}$ atoms per cubic centimeter and a gradient of about $2 \times 10^{18}$ atoms per centimeter$^4$.

* * * * *